United States Patent
Rao et al.

(10) Patent No.: US 9,643,847 B2
(45) Date of Patent: May 9, 2017

(54) METHOD FOR GROWTH OF VERTICALLY ALIGNED CARBON NANOTUBES ON DIAMOND SUBSTRATES

(71) Applicant: Honda Motor Co., Ltd., Tokyo (JP)

(72) Inventors: Rahul Rao, Columbus, OH (US); Avetik Harutyunyan, Columbus, OH (US)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 14/216,088

(22) Filed: Mar. 17, 2014

(65) Prior Publication Data

US 2014/0272137 A1  Sep. 18, 2014

Related U.S. Application Data

(60) Provisional application No. 61/793,286, filed on Mar. 15, 2013.

(51) Int. Cl.
C23C 16/26  (2006.01)
C01B 31/02  (2006.01)
C23C 16/02  (2006.01)

(52) U.S. Cl.
CPC ...... *C01B 31/0233* (2013.01); *C23C 16/0209* (2013.01); *C23C 16/26* (2013.01); *C01B 2202/08* (2013.01)

(58) Field of Classification Search
CPC ................... C23C 16/0209; C23C 16/26
USPC ............................ 427/249.1, 249.6
See application file for complete search history.

(56) References Cited

U.S. PATENT DOCUMENTS

| | | | |
|---|---|---|---|
| 5,187,021 A * | 2/1993 | Vydra | C03C 25/101 428/378 |
| 2007/0189953 A1* | 8/2007 | Bai | B82Y 30/00 423/414 |
| 2007/0298168 A1* | 12/2007 | Ajayan et al. | 427/249.1 |
| 2010/0171409 A1* | 7/2010 | Ando et al. | 313/311 |
| 2010/0323207 A1* | 12/2010 | Pinault et al. | 428/446 |
| 2012/0181501 A1* | 7/2012 | Sung | 257/9 |
| 2012/0192931 A1* | 8/2012 | Jeon et al. | 136/252 |
| 2013/0273720 A1* | 10/2013 | Sumant et al. | 438/478 |

* cited by examiner

*Primary Examiner* — Elizabeth Burkhart
(74) *Attorney, Agent, or Firm* — Arent Fox LLP

(57) ABSTRACT

Method of growing carbon nanotubes which are substantially vertically aligned on a diamond-based substrate via a chemical vapor deposition system utilizing an iron-based catalyst is disclosed.

15 Claims, 4 Drawing Sheets

Step 1. Graphitization of diamond Film

Step 2. Growth of CNT Forest on Graphitized Diamond film

METHOD FOR GROWTH OF VERTICALLY ALIGNED CARBON NANOTUBES ON DIAMOND SUBSTRATES

RELATED APPLICATIONS

The present application claims benefit from earlier filed U.S. Provisional Application No. 61/793,286, filed Mar. 15, 2013, which is incorporated by reference in its entirety for all purposes.

BACKGROUND

Field of the Invention

The present teachings are directed to methods to produce carbon nanotubes (hereinafter "CNTs") on an appropriate substrate by thermal deposition of a catalyst metal precursors, for example, ferrocene, along with a carbon feedstock by chemical vapor deposition (hereinafter "CVD") followed by growth of the CNTs.

Discussion of the Related Art

Hague et al. in U.S. Patent Appln. Pub. US 2011/0311427 A1 describe CNT arrays grown on carbon substrates including diamond, carbon foil and carbon fibers. A catalyst layer is deposited on a substrate and then coated with an insulating layer like alumina. This structure is then heated to activate the catalysts and crack the insulating layer. The structure with the activated catalysts and the cracked insulation are then exposed to CNT growth conditions.

Hague et al. also discuss in paragraph 0005 how direct growth of dense arrays of CNTs on a carbon surface, including diamond is not possible by conventional growth methods. Even though CVD methods were well known to Hague et al., there is no suggestion that their substrates would be applicable or desirable for CVD growth of CNTs.

There is a need for a method of growing vertically aligned CNTs on a carbon-based substrate via a CVD method utilizing catalyst components, such as ferrocene-based catalysts.

SUMMARY

The present teachings are directed to a method of in situ growth of carbon layers on a diamond substrate by graphitization at high temperature (670 to 1300 C), followed by thermal deposition of a catalyst metal precursor, like ferrocene, by chemical vapor deposition (hereinafter "CVD") to produce carbon nanotubes, specifically, forests of substantially vertically aligned CNTs.

The present disclosure is directed to a method for the graphitization or carbonization growth of a carbon layer on top of a diamond film substrate prior to CNT growth via a CVD method utilizing various catalyst components, including ferrocene-based catalysts, capable of producing a forest of vertically-aligned CNTs.

BRIEF DESCRIPTION OF THE DRAWINGS

The accompanying drawings, which are included to provide a further understanding of the invention and are incorporated in and constitute a part of this specification, illustrate preferred embodiments of the invention and together with the detailed description serve to explain the principles of the invention. In the drawings.

DETAILED DESCRIPTION

The presently disclosed method for producing carbon nanotubes includes providing a diamond-based substrate, treating the diamond-based substrate to obtain a coating of carbon-based material thereon, contacting a catalyst capable of producing carbon nanotubes with the carbon-coated diamond-based substrate, exposing the catalyst to a vapor phase carbon source, and then producing carbon nanotubes.

According to the present disclosure, the diamond-based substrate can be a diamond film or a diamond particle. This diamond-based substrate can be treated by heating the diamond-based substrate to a temperature sufficient to produce a coating of carbon-based material thereon. The carbon-based material can be any of graphene or graphite, or other carbon allotropes, and in some cases can be any organized carbon coating on the surface of the diamond-based substrate.

The metal catalyst precursors suitable for the present method can include chromocene, ferrocene, cobaltocene, nickelocene, molybdocene dichloride, ruthenocene, and rhodocene. These metal precursors can be used alone in the feedgas or can be mixed with other materials including thiophene, and other vapor phase carbon source components, such as, methane. In some instances, the vapor phase carbon source can include other carbon-containing compounds, such as n-hexane, xylenes, and alcohols.

For the present method, the catalyst can comprise at least one metal selected from the group consisting of chromium, manganese, iron, cobalt, nickel, copper, molybdenum, ruthenium, and rhodium. As illustrated in the FIG. 3, iron is a particularly favored catalytic metal for the present process.

In the present method, the carbon nanotubes produced by the described process are aligned substantially vertical from the top surface of the diamond-based substrate. These CNTs are preferred, in some instances, over the spaghetti-like CNTs arrays where the nanotubes are substantially intertwined with one another. These vertical arrays of CNTs can be especially useful in thermal management systems for electronic components such as processing chips which generate significant amounts of heat.

It should be noted that the temperatures provided in the Figures are exemplary in nature and not limiting to the present disclosure. One of skill in the art will recognize that various heating conditions, such as time, temperature and atmosphere will impact the resulting carbon layer on the diamond film in one phase of the presently disclosed method, and in another phase of the presently disclosed method, the quantity and quality of the CNTs produced.

Figure 1:
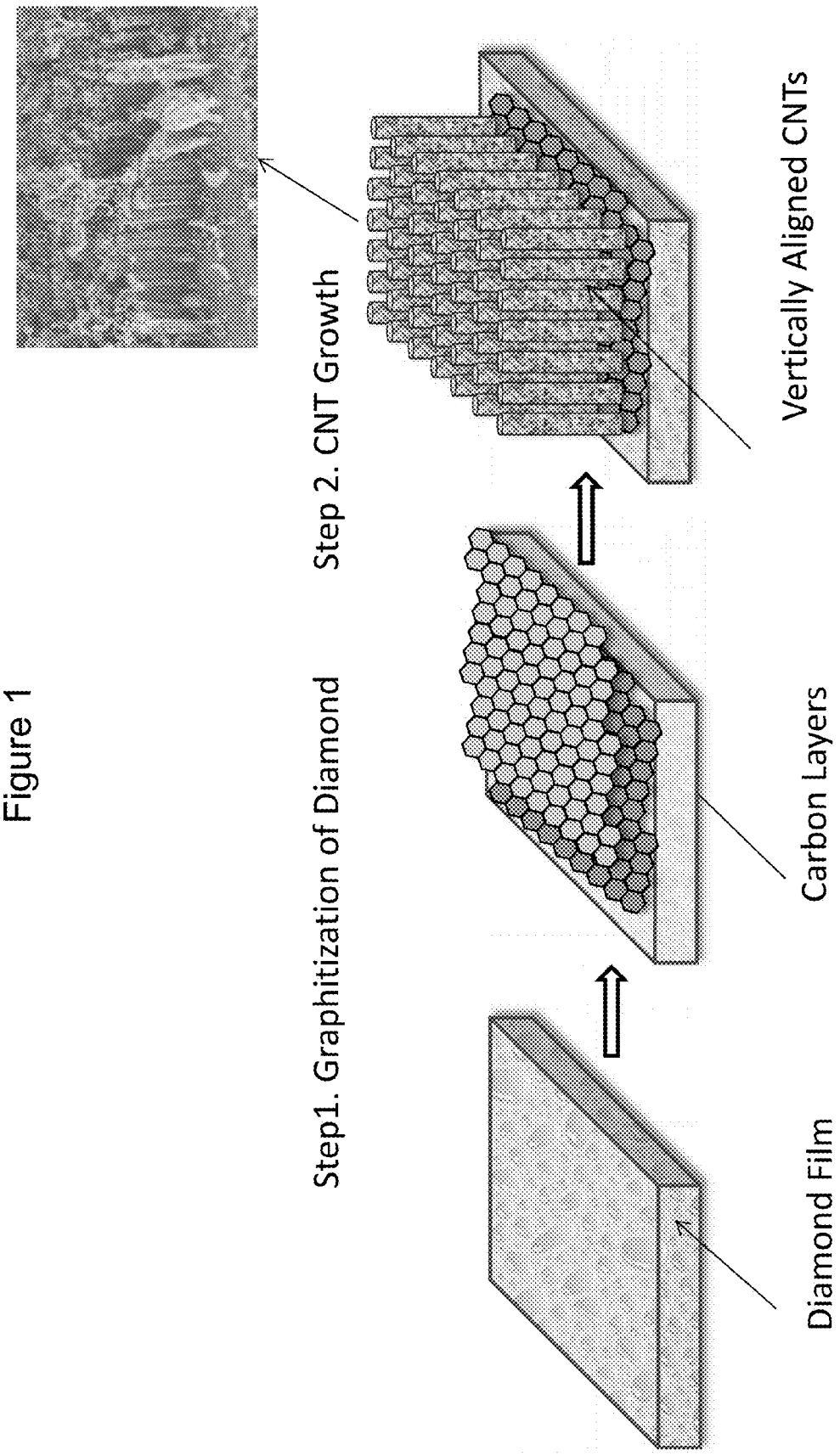
FIG. 1 is an illustration of the presently disclosed process with vertically aligned carbon nanotubes illustrated in the microphotograph insert.
Figure 2:
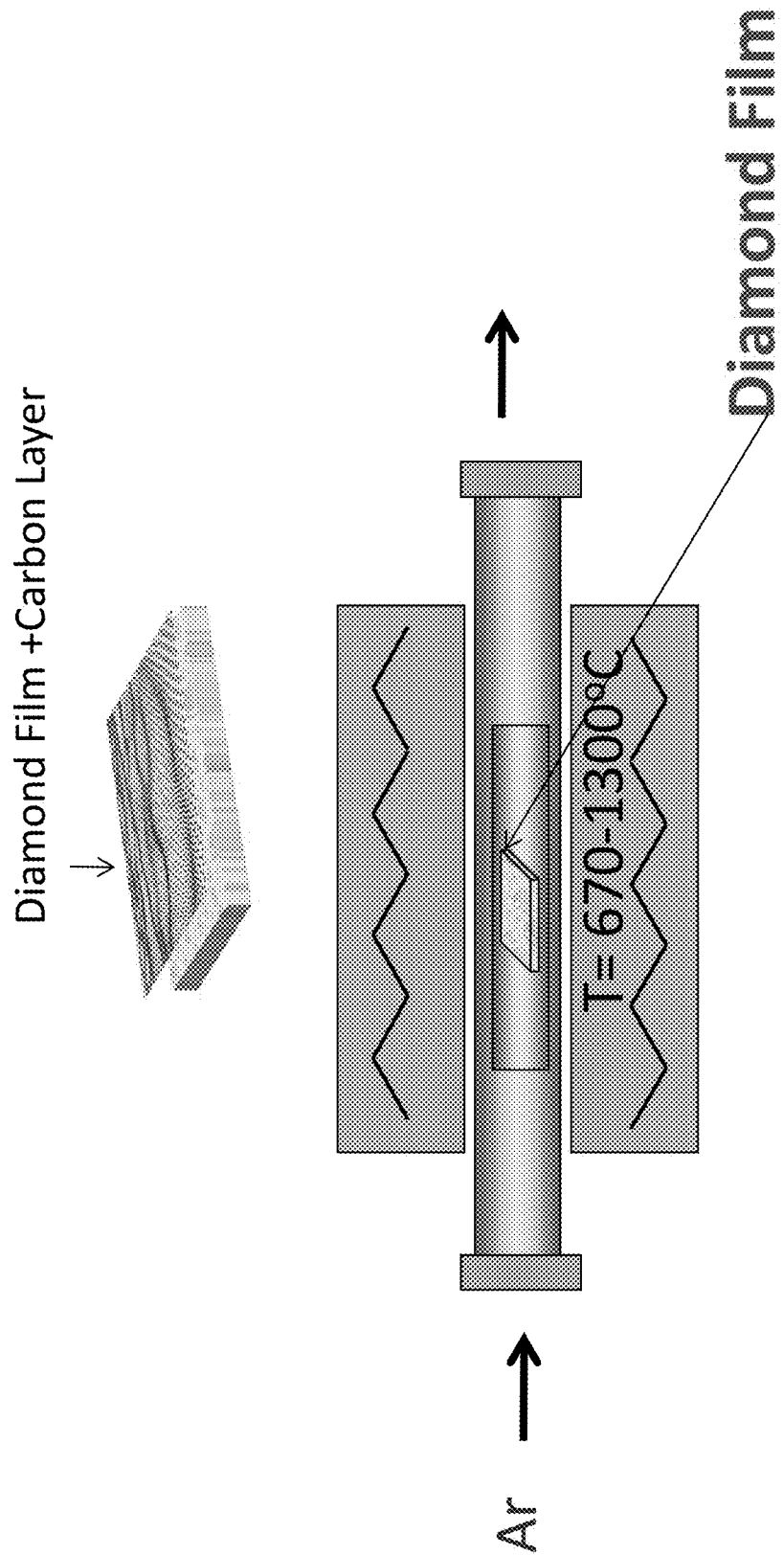
FIG. 2 is an illustration of the graphitization process of the diamond-based substrate according to the present disclosure.

The temperature range for the graphitization step can range from about 670 to about 1300 C for the system utilizing an Ar environment to produce in situ a carbon layer on the surface of the diamond substrate, as illustrated in FIG. 2. A mixture of Ar and $H_2$ can also be used as the feedgas; and the temperature of the diamond substrate can be at a temperature range of 700 to 800 C with a graphitization time of 15 hours, for example. Changes in the feedgas atmosphere and any other pretreatments of the diamond substrate will affect the time and temperature conditions needed to produce a suitable carbon layer on the surface of the diamond substrate.

Figure 3:
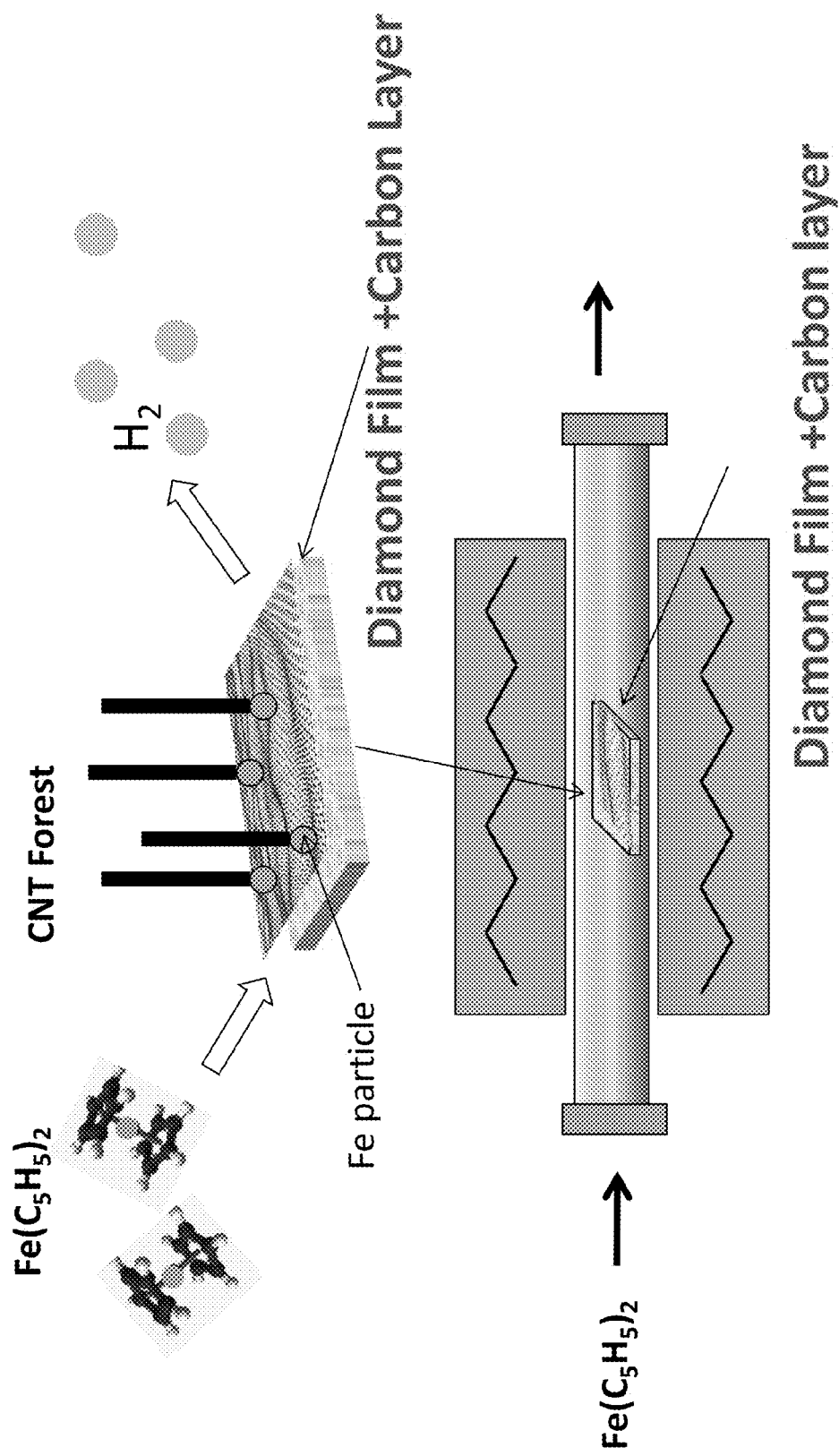
FIG. 3 is an illustration of the deposition of catalyst on the carbon-coated diamond-based substrate and growth of carbon nanotubes according to the present disclosure, and FIG. 4 A and FIG. 4 B are SEM images of bare (4A) and graphene-covered (4B) diamond substrates.

The CNT growth step is illustrated in FIG. 3 for a system using ferrocene as the catalyst precursor at a substrate temperature of 750 C. It should be noted that a catalyst precursor component that has carbon-containing substituents, like a cyclopentadienyl ring or two, can provide both the catalyst metal and a source of vapor phase carbon. Selection of a different catalyst and/or catalyst precursor will impact the temperature required to grow the desired CNT forest array. For instance, use of a substituted cyclopentadienyl ring and/or a different catalyst metal will affect the deposition of the metal and growth of the CNTs. For example, use of ferrocene in a xylene solution at a ferrocene concentration ranging from 0.01 to 0.2 g/mL can be fed into a CVD system over the graphitized diamond substrate for a time period up to 5 hours. Additionally, inclusion of a separate vapor phase carbon source, like methane, to increase the concentration of carbon in the system will affect the growth rate of the CNT array.

Also disclosed here is a method for producing an array of vertically aligned carbon nanotubes by first providing a diamond-based substrate having a top surface, and then heating the diamond-based substrate under an environment to a temperature sufficient to coat at least the top surface with a carbon layer. A vapor phase composition containing a catalyst capable of producing carbon nanotubes and a carbon source is then provided and followed by contacting the vapor phase composition with the carbon layer. Particles of the catalyst are deposited on the carbon layer, and the array of vertically aligned carbon nanotubes is produced on the top surface of the diamond-based substrate.

Additionally, the diamond-based substrate used in the presently disclosed method can be a diamond film or a diamond particle.

The heating process of this present method can occur under an environment including an inert gas-containing atmosphere or a carbon-containing atmosphere. In some cases, the heating can occur under alternating atmospheres of an inert gas-containing atmosphere and a carbon-containing atmosphere.

The resulting carbon layer can be graphene or graphite. In some instances, the carbon layer can be other carbon allotropes. The catalyst can be selected from the group consisting of chromium, manganese, iron, cobalt, nickel, copper, molybdenum, ruthenium, and rhodium.

It is desirable that the presently disclosed method produces carbon nanotubes that are aligned substantially vertical up from the top surface of the diamond-based substrate. This type of forest array of vertically aligned CNTs is preferred over the well-known spaghetti like masses of intertwined carbon nanotubes. Among other attributes, the forest array of CNTs can have surface areas double that of the spaghetti form of CNT array.

FIGS. 4A and 4B are SEM images of, respectively, an untreated diamond substrate in FIG. 4A which shows vary sparse CNT growth even under high magnification as shown in the insert, and in FIG. 4B a graphene-covered diamond substrate after identical growth conditions which exhibits vertically aligned CNTs.

Figure 4:
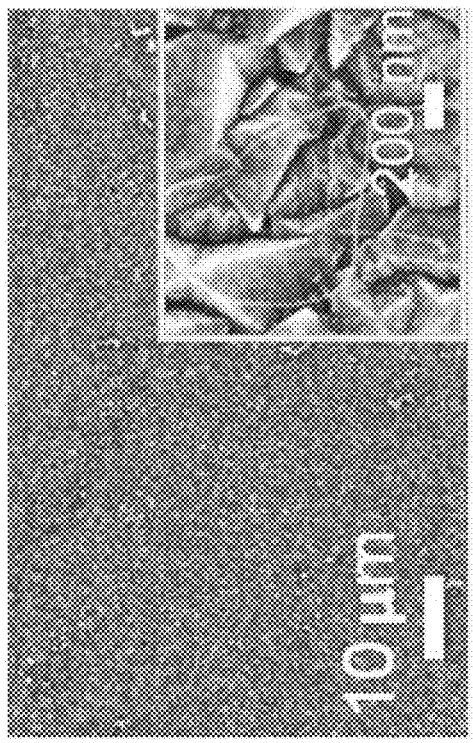
Figure 4:
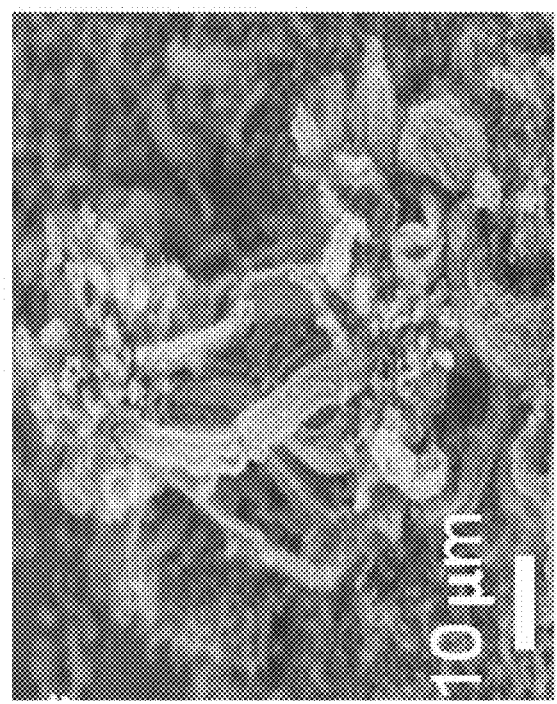

The CNTs shown in FIGS. 4 A and B were grown at ambient pressure via a floating catalyst CVD method using ferrocene and xylene as the catalyst and carbon source, respectively. Ferrocene (10 wt. %) was dissolved in xylene through mild sonication. The mixture was then loaded into a syringe and delivered into a quartz tube furnace through a capillary tube connected to a syringe pump. The capillary tube was placed such that its exit point was just outside the hot zone of the tube furnace. The graphene coating on the top surface of a diamond substrate was grown by graphitization of the diamond surface when exposed to temperatures of 670 to 1300 C for several hours. The bare and coated diamond substrates was loaded into the center of the quartz tube furnace, which was heated to a temperature ranging from 700 to 800 C under a constant flow of argon (500 sccm) and hydrogen (60-120 sccm). After the furnace reached temperature, the ferrocene/xylene mixture was injected continuously into the tube furnace at a rate of 1.2 ml/hr for the duration of the CNT growth (few seconds to 6 hours). At the end of the growth period the furnace was turned off and allowed to cool down to room temperature under the argon/hydrogen flow.

The growth process produced vertically aligned carbon nanotubes that, according to present theory and without being limited thereto, grow via root growth on the graphene-covered diamond substrate. The heights of the CNT forests could be controlled by the precursor injection time, with typical growth rates at approximately 1 μm/min. Post-growth characterization of the samples was performed with scanning electron microscopy (Zeiss Ultra 55 Plus) and micro-Raman spectroscopy (Renishaw Raman microscope, 633 nm excitation).

EXAMPLE 1

A diamond substrate (4-8 mm) with a flat top surface can be placed inside a tube furnace and heated to a surface temperature of 750 C for 15 hours under a flow of Ar gas (500 standard cubic centimeter per minute, "sccm") and $H_2$ gas (100 sccm.)

The feedgas can then be changed to a ferrocene/xylene mixture. The ferrocene can be dissolved in xylene at a concentration of about 0.1 g/mL in the liquid solution. This liquid can then be fed into the tube furnace system with the Ar and $H_2$ carrier gas mix. The temperature at the substrate can be kept at 750 C. After being exposed to the ferrocene/xylene mixture for 240 minutes, the liquid feed can be stopped, and the substrate cooled under the Ar/$H_2$ gas.

The substrate can be removed from the tube furnace and subjected to Raman spectroscopy can show a spectrum with the G band (at about 1580 $cm^{-1}$) and the D band (about 1345 $cm^{-1}$) indicative of carbon nanotube structures. SEM images can show the substantially vertical arrangement of the CNT array.

EXAMPLE 2

A diamond substrate (4-8 mm) with a flat top surface can be placed inside a tube furnace and heated to a surface temperature of 700 C for 15 hours under a flow of Ar gas (500 standard cubic centimeter per minute, "sccm") and $H_2$ gas (100 sccm.)

The feedgas can then be changed to a nickelocene/thiophene mixture. The nickelocene can be dissolved in thiophene at a concentration of about 0.2 g/mL in the liquid solution. This liquid can then be fed into the tube furnace system with the Ar and $H_2$ carrier gas mix. The temperature at the substrate can be kept at 700 C. After being exposed to the nickelocene/thiophene mixture for 120 minutes, the liquid feed can be stopped, and the substrate cooled under the Ar/$H_2$ gas.

The substrate can be removed from the tube furnace and subjected to Raman spectroscopy can show a spectrum with the G band (at about 1580 cm$^{-1}$) and the D band (about 1345 cm$^{-1}$) indicative of carbon nanotube structures. SEM images can show the substantially vertical arrangement of the CNT array.

All publications, articles, papers, patents, patent publications, and other references cited herein are hereby incorporated by reference herein in their entireties for all purposes.

Although the foregoing description is directed to the preferred embodiments of the present teachings, it is noted that other variations and modifications will be apparent to those skilled in the art, and which may be made without departing from the spirit or scope of the present teachings.

The foregoing detailed description of the various embodiments of the present teachings has been provided for the purposes of illustration and description. It is not intended to be exhaustive or to limit the present teachings to the precise embodiments disclosed. Many modifications and variations will be apparent to practitioners skilled in this art. The embodiments were chosen and described in order to best explain the principles of the present teachings and their practical application, thereby enabling others skilled in the art to understand the present teachings for various embodiments and with various modifications as are suited to the particular use contemplated. It is intended that the scope of the present teachings be defined by the following claims and their equivalents.

What we claim is:

1. A method for producing carbon nanotubes comprising:
   providing a diamond-based substrate free of metal catalyst;
   treating the diamond-based substrate by heating under an atmosphere to a temperature sufficient to obtain a coating of graphene on a surface thereof, wherein the coating comprises at least one graphene lattice layer parallel to the surface;
   contacting a vapor phase catalyst capable of producing carbon nanotubes with the graphene-coated diamond-based substrate;
   exposing the catalyst to a vapor phase carbon source, and producing carbon nanotubes.

2. The method according to claim 1, wherein diamond-based substrate comprises a diamond film or a diamond particle.

3. The method according to claim 1, wherein the atmosphere comprises an inert gas-containing atmosphere.

4. The method according to claim 3, wherein the temperature ranges from 670 to 1300 C.

5. The method according to claim 1, wherein the catalyst comprises at least one member selected from the group consisting of chromium, manganese, iron, cobalt, nickel, copper, molybdenum, ruthenium, and rhodium.

6. The method according to claim 1, wherein the carbon nanotubes are aligned substantially vertical from the diamond-based substrate.

7. A method for producing an array of vertically aligned carbon nanotubes comprising:
   providing a diamond-based substrate free of metal catalyst having a top surface;
   heating the diamond-based substrate free of metal catalyst under an environment including hydrogen to a temperature sufficient to carbonize the top surface of the diamond-based substrate to a graphene layer having at least one graphene lattice layer positioned parallel to the underlying diamond-based substrate;
   providing a vapor phase composition containing a catalyst precursor capable of producing a metal catalyst,
   contacting the vapor phase composition with the graphene layer in the presence of hydrogen;
   depositing particles of the metal catalyst from the metal catalyst precursor on the graphene layer, and
   producing an array of vertically aligned carbon nanotubes on the metal catalyst on the graphene layer of the diamond-based substrate.

8. The method according to claim 7, wherein diamond-based substrate comprises a diamond film or a diamond particle.

9. The method according to claim 7, wherein the environment comprises at least one member selected from the group consisting of an inert gas-containing atmosphere and a carbon-containing atmosphere.

10. The method according to claim 7, wherein the catalyst comprises at least one member selected from the group consisting of iron, cobalt, manganese, nickel, copper and molybdenum.

11. The method according to claim 7, wherein the carbon nanotubes are aligned substantially vertical to the top surface of the diamond-based substrate.

12. The method according to claim 7, wherein the diamond-based substrate is heated to a temperature ranging from 670 to 1300 C.

13. A method for producing carbon nanotubes comprising:
   providing a diamond-based substrate including a top surface free of metal catalyst;
   heating the diamond-based substrate in an atmosphere including hydrogen to obtain a layer of a carbon-based material on the top surface, the layer comprising at least one lattice layer parallel to the top surface;
   providing a vapor phase catalyst precursor capable of forming a metal catalyst for producing carbon nanotubes;
   depositing the metal catalyst from the catalyst precursor on the layer;
   exposing the metal catalyst to a vapor phase carbon source; and
   producing carbon nanotubes.

14. The method according to claim 13, wherein the diamond-based substrate is heated under an atmospheric pressure.

15. The method according to claim 13, wherein the carbon-based material comprises graphene.

* * * * *